United States Patent

[11] 3,588,634

[72] Inventors Marvin M. Cohen
Rockville;
James D. Penar, Silver Spring, Md.; David W. Kurtz, Arlington, Va.

[21] Appl. No. 858,052
[22] Filed Sept. 15, 1969
[45] Patented June 28, 1971
[73] Assignee The United States of America as represented by the Secretary of the Army

[54] HOT-PRESSED SEMICONDUCTOR DIODE SWITCH
10 Claims, 8 Drawing Figs.

[52] U.S. Cl. .......... 317/234, 317/237, 29/576
[51] Int. Cl. .......... H01l 3/00, H01l 7/00, H01l 7/32
[50] Field of Search .......... 317/237, 238, 235, 234

[56] References Cited
UNITED STATES PATENTS

| | | | |
|---|---|---|---|
| 3,080,441 | 3/1963 | Willardson et al. | 317/235X |
| 3,271,591 | 9/1966 | Ovshinsky | 317/237X |
| 3,343,034 | 9/1967 | Ovshinsky | 317/235X |
| 3,343,085 | 9/1967 | Ovshinsky | 316/235X |
| 3,432,729 | 3/1969 | Dyre | 317/234 |

*Primary Examiner*—James D. Kallam
*Attorneys*—Harry M. Saragovitz, Edward J. Kelly, Herbert Berl and J. D. Edgerton

ABSTRACT: A high energy radiation resistant semiconductor diode which is prepared by forming a PN point junction onto the surface of a wafer formed by hot-pressing degenerately doped particulate semiconductor material, said radiation resistant semiconductor diode being characterized by either unidirectional or bidirectional switching characteristics. A technique for preparing said radiation resistant semiconductor diode comprises preparing a melt of semiconductor material, doping the melt with an N-type material, crystallizing the doped melt, comminuting the doped crystal to a predetermined particle size and hot-pressing the particles so as to form a semiconductor wafer having a reproducible electrical characteristic. In a first embodiment, the wafer is contacted with a metallic whiskerlike probe to form the necessary PN junction, and is alloyed on a second surface to an ohmic contact. This embodiment provides a diode with a unidirectional "switching" characteristic. Alternatively, the wafer is contacted with two metallic whiskerlike probes so as to form two PN junctions. This alternative embodiment produces a diode which is capable of bidirectional switching.

INVENTORS
MARVIN M. COHEN
JAMES D. PENAR
DAVID W. KURTZ

BY

ATTORNEYS

INVENTORS
MARVIN M. COHEN
JAMES D. PENAR
DAVID W. KURTZ

BY [signatures]
ATTORNEYS

INVENTORS
MARVIN M. COHEN
JAMES D. PENAR
DAVID W. KURTZ
BY Harry M. Saragovitz, Edward J. Kelly, Herbert Berl and J. D. Edgerton
ATTORNEYS

HOT-PRESSED SEMICONDUCTOR DIODE SWITCH

BACKGROUND OF THE INVENTION

This invention relates to a noncrystalline point junction-type semiconductor diode and more particularly to a high nergy radiation resistant point junction-type diode formed vith a hot-pressed degenerately doped semiconductor wafer.

With the increased use of nuclear energy for both military nd industrial applications, the need for electrical circuit elenents which are resistant to high energy radiation has become ncreasingly important. Currently, most semiconductor levices are formed by diffusing various impurities into a solid rystal, such as a crystalline wafer of silicon, germanium or the ike, or by alloying or epitaxially growing a P-or N-type naterial onto a crystal of opposite characteristic. The electrical properties of these devices generally depend on the paricular arrangement of the impurities and on the particular tructure of the crystal. When subjected to high energy radiaion, the position of the impurities in the crystal itself can be ubstantially altered thereby significantly altering or destroyng the electrical characteristics of the device.

Some thought has been given by the prior art to alleviating he radiation problem, but most research in this area has been lirected toward the concept of providing shielding devices to prevent exposure of the semiconductor to the radiation. Heretofore, very little attention has been given to the concept of altering the semiconductor structure itself in order to ender it more resistant to the effects of radiation.

Unlike the prior art, it has now been proposed to use noncrystalline semiconductor devices in applications involving radiation exposure. Since high energy radiation normally has its greatest detrimental effect when the semiconductor is n a highly crystalline or well ordered state, it was thought that a noncrystalline semiconductor would not deleteriously be affected by radiation. Although the advantages of noncrystalline semiconductor devices were recognized, virtually all semiconductor devices were crystalline in structure. Recently, however, there was reported by Ovshinsky in U.S. Pat. No. 3,271,591, an amorphous, or noncrystalline semiconductor diode formed from chalcogenide glasses. These diodes have been disclosed as having been formed by hot-pressing surface treated pellets of semiconductor material into a wafer and then allowing a suitable ohmic content onto the wafer. The pellets forming the wafer were surface treated in order to increase the number of defects present in the final structure. Typical surface treating techniques included grinding, etching or chlorinating, or exposing the pellets to high energy radiation or to an oxidizing atmosphere.

The Ovshinsky diodes are not only characterized by an amorphous structure, which would render them relatively radiation-resistant, but they are also characterized by an unusual and an advantageous resistivity characteristic which has heretofore been only found to exist in certain GaAs crystalline thin films. The Ovshinsky diode has been shown to demonstrate a "switching" characteristic whereby the diode breaks down under the influence of a particular applied voltage and becomes extremely conductive at a lower voltage. This phenomena is shown graphically in FIG. 1. According to the Ovshinsky diode, as the applied voltage across the diode is increased, the diode potential, and the current output, very gradually increases. At the "breakdown" voltage, the resistivity suddenly drops and the current output rises asymptotically and the potential across the diode drops to a much lower value; that is to say, the voltage across the diode "-switches" to a lower value.

The same phenomena also has been found to occur in thin film crystalline GaAs diodes, except that the current initially rises at a much more rapid rate, something akin to a "soft diode." Moreover, the difference between the "breakdown" voltage and the "switched" voltage, is much less. The resistivity curve of the GaAs thin film diode is shown in FIG. 2. Unlike the Ovshinsky diode, the GaAs thin film does is subject to destruction by exposure to high energy radiation due to its well ordered crystalline state.

A somewhat similar result to the "switching" phenomena found in the Ovshinsky diode, can be obtained with the state-of-the-art crystalline tunnel diodes whose resistance curve, as shown in FIG. 3, initially rises to a peak, gradually falls in a negative resistance manner to a minimum resistivity point, and then rises again to an avalanche breakdown point. By biasing the diode at its peak B, the voltage can be changed from B to A at the same current level.

In both the Ovshinsky diode and the GaAs diode, the "-switching" phenomena occurs regardless of whether the diode is biased in the forward or reverse directions, whereas in the tunnel diode, the negative resistance is only present in a single or forward direction. In the reverse direction, a tunnel diode is always highly conductive.

There is currently no diode, therefore, which is capable of "switching" only in the forward direction as a tunnel diode, yet which is resistant to high energy radiation as is the Ovshinsky diode.

One serious problem has been recognized in the Ovshinsky diode; due to the technique of manufacturing, it has been difficult to control the electrical properties of the final product. The Ovshinsky technique is deficient in this respect, since it is primarily concerned with imparting as large an amount of disorder into the structure as possible. In order to control the electrical properties, however, it would be desirable to impart a controlled amount of disorder or a controlled amount of random imperfections in the structure.

By using the Ovshinsky technique, there is no way of imparting such a controlled amount of disorder, and hence there is no way of controlling the degree of voltage drop between the breakdown voltage and the "switched" voltage. Moreover, there is no way of controlling the point at which "breakdown" will occur. Although some degree of control can be obtained by Ovshinsky, by varying the type of chalcogenide glass, this does not provide as efficient control of the various parameters.

SUMMARY OF THE INVENTION

Accordingly, it is an object of this invention to provide a semiconductor diode which is resistant to high energy radiation.

It is another object of this invention to provide a semiconductor diode with is capable of exhibiting a unidirectional "-switching" phenomena, similar to a tunnel diode, yet which can also be prepared so as to function as a multidirectional switch, such as the GaAs thin film diodes, or the Ovshinsky diode.

Still another object of this invention is to provide a semiconductor diode which is capable of exhibiting a "switching" phenomena, yet whose electrical characteristics can be controlled and predetermined.

These and other objects have now herein been attained by the technique of preparing a melt of semiconductor material, doping the melt with an N-type material, crystallizing the doped melt, comminuting the doped crystal to a predetermined particle size and hot-pressing the particles so as to form a semiconductor wafer having a reproducible electrical characteristic. In a first embodiment, the wafer is contacted with a metallic whiskerlike probe to form the necessary PN junction, and is alloyed on a second surface to an ohmic contact. This embodiment provides a diode with a unidirectional "switching" characteristic. Alternatively, the wafer is contacted with two metallic whiskerlike probes so as to form two PN junctions. This alternative embodiment produces a diode which is capable of bidirectional switching.

DETAILED DESCRIPTION OF THE INVENTION

Figure 1:
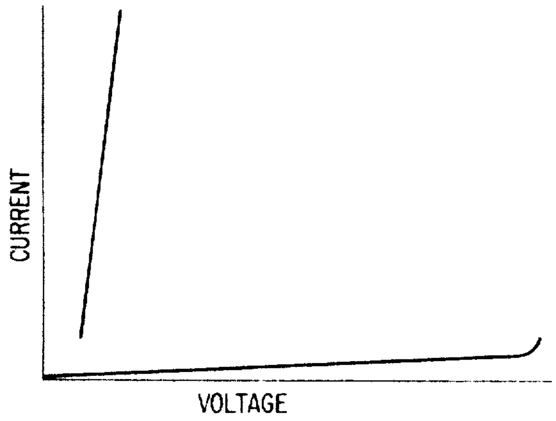
FIG. 1 is a graph of the resistance of the Ovshinsky diode.
Figure 2:
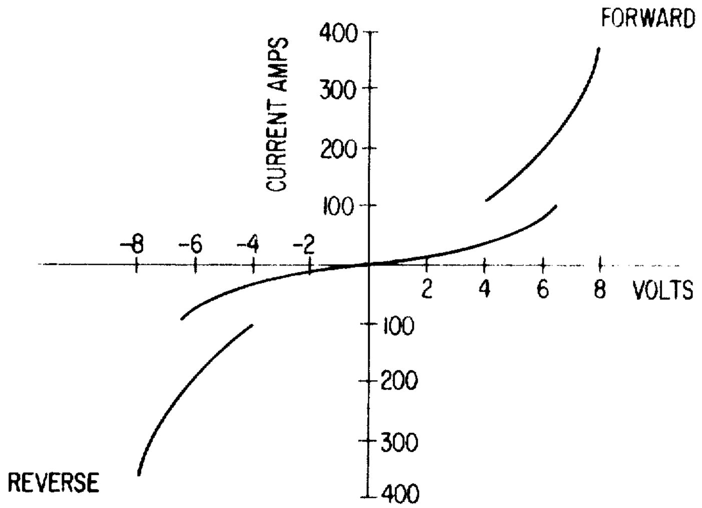
FIG. 2 is a graph of the resistance of a thin-film GaAs diode.
Figure 3:
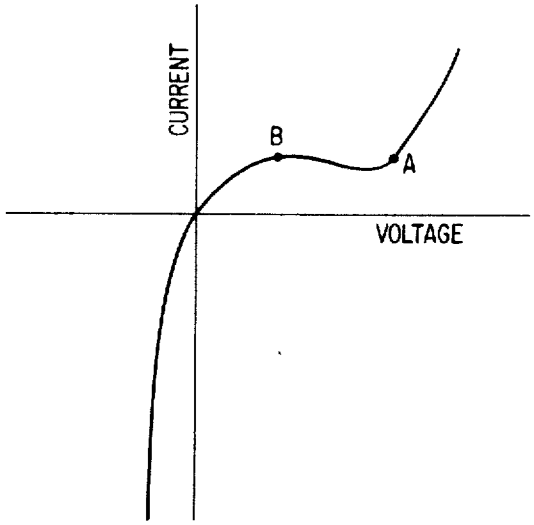
FIG. 3 is a graph of the resistance of a typical tunnel diode.
Figure 4:
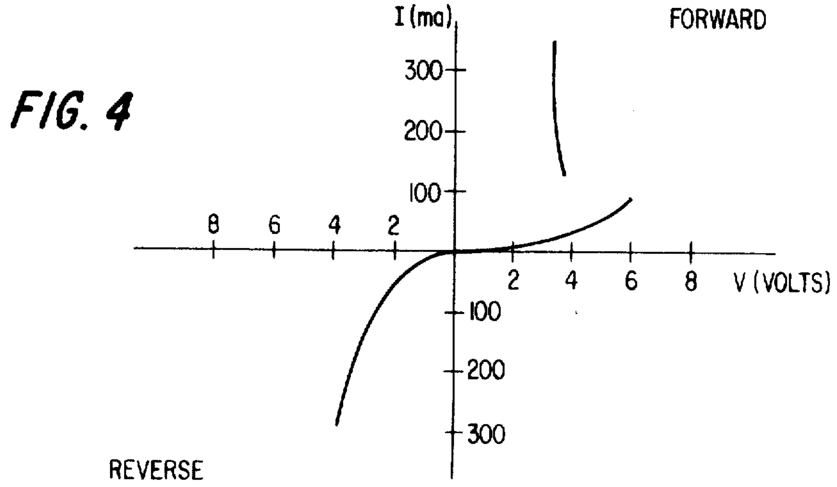
FIG. 4 is a graph of the resistance of a diode of the present invention when connected with a single metallic whisker probe and a single ohmic contact, so as to form a unidirectional switching device.
Figure 5:
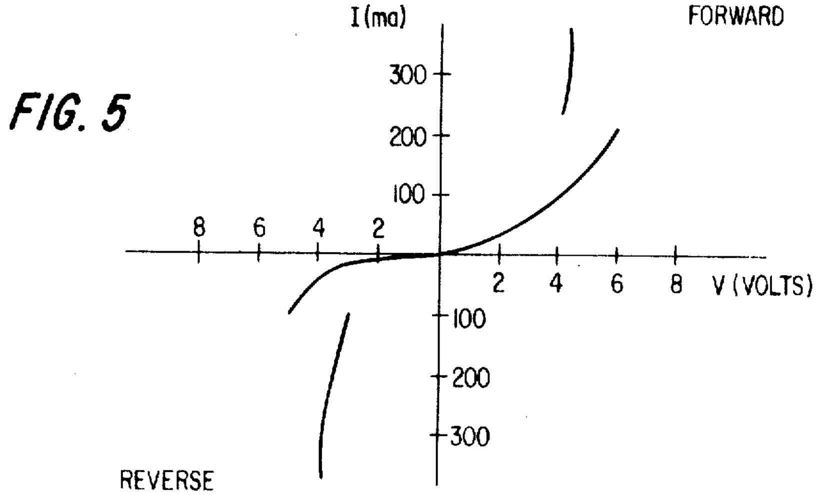
FIG. 5 is a graph of the resistance of the diode of the present invention when connected with two metallic whisker-type probes, so as to form a bidirectional switching device.
Figure 6:
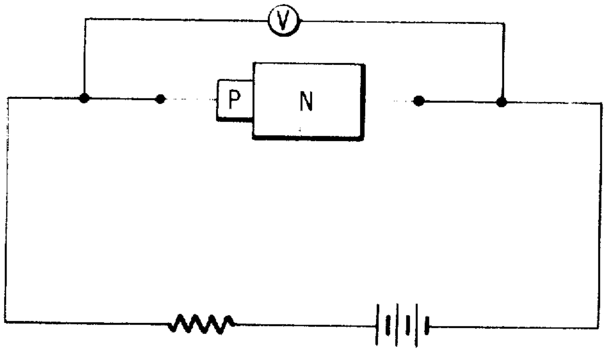
FIG. 6 is a unidirectional switching diode of the present invention which has been placed into series with a resistance and applied voltage so as to measure the switching characteristics of the diode.

A melt of semiconductor materials is prepared by heating germanium, silicon or the like, or a compound semiconductor material such as GaAs, GaP, ZnTe, and the like, to a significantly high temperature in a suitable crucible. The melt is then degenerately doped with an N-type or P-type material by adding the dopant directly to the melt. Suitable N-type materials include the Group V elements of the Periodic Table of Elements, such as arsenic, potassium, antimony, or the like. Suitable P-type materials include the Group III elements of the Periodic Table of Elements such as aluminum, boron, zinc, or the like.

The concentration of the dopant in the melt can be varied from $10^{18}$ per cc. to $10^{20}$ per cc. without loss of the switching characteristics. Preferably, for best results, the concentration should be maintained within the range of from $10^{19}$ per cc. to $10^{20}$ per cc.

The doped material is then cooled to below its crystallization temperature, and the crystals so formed are comminuted into a fine particulate consistency. Particle size should be between about 2 microns and 50 microns.

The fine particles are then compacted into a wafer by hot-pressing the particles at a temperature between room temperature and 400° K. and a pressure of between 3000 p.s.i. and 30,000 p.s.i. The size of the wafers so formed can be varied over wide limits of from between one-eighth inch thickness and one-fourth inch in diameter and one-fourth inch in thickness and 2 inches in diameter, depending upon ultimate use.

When a unidirectional switch is desired, an Ohmic contact, such as indium, is alloyed onto one surface of the wafer. This can be accomplished in any desired manner, such as by mechanically pressing, fusing, soldering, vapor depositing, or the like. One convenient manner for accomplishing this result is to alloy the contact material onto the wafer at 500° K. The surface area of the Ohmic contact relative to the surface area of the wafer is not critical, and may range from between about 0.001 $mm.^2$ and 1 $mm^2$.

The necessary PN junction is then formed on a different portion of the wafer by pressing a whiskerlike metallic probe of an opposite conductivity as the dopant into contact with the wafer in the manner of preparing a point contact diode. Preferably, the whisker probe should have a diameter of between about 0.005 inches and 0.050 inches, depending on the size of the wafer. When P-type whiskers are desired, whiskers of tungsten have been found to be particularly suitable, although other metallic whiskers, such as molybdenum, copper or titanium can also be used.

When a bidirectional diode is desired, two whiskers are contacted to the same or opposite surface of the wafer so as to form two PN junctions. In this instance, since the whiskers also function in the electrode contacts, it is unnecessary to prepare an Ohmic contact as is the case in the unidirectional diode.

Having generally described the invention, a better understanding can be obtained by reference to certain specific examples which are presented here for purposes of illustration only and are not to be considered to be limiting in any manner.

EXAMPLE 1

A germanium melt was doped with arsenic and the resultant boule comminuted to a powder having an average particulate size of 2 microns. The powder was hot-pressed at a temperature of about 350° K. and at 3,000 p.s.i. into bulk form. A number of samples were fabricated from germanium boules with arsenic concentrations ranging from $10^{18}$ to $10^{20}$ per cc. The resulting wafers were one-fourth inch in thickness and 2 inches in diameter. Ohmic contacts were achieved by alloying 0.25 mm. diameter of spheres of 99 percent Sn, 1 percent Sb to the bulk material.

Devices were fabricated from cylinders of 3.5 mm. in diameter and 0.87 mm. in thickness. Contacts were made either with two contact tungsten probes each having a contact area of approximately $15\times10^{14}$ $mm.^2$ or with one probe and one Ohmic contact. It was found that one point and one alloyed contact produces a unipolar device which switches when the tungsten probe is biased negatively. This direction is designated as the forward direction. The reverse direction is always very conductive. Contacting the wafer body with two tungsten probes, however, consistently produces a bipolar device which is capable of switching in both forward and reverse directions.

These results indicate that breakdown is contact dependent and that the negative resistance arises from a sharp increase in mobility initiated at the contact.

Unipolar and bipolar devices can only be fabricated if the hot-pressed samples are doped to degeneracy, usually concentrations greater than $10^{18}$ per cc. Although large impurity concentrations seem to create favorable conditions for the onset of negative resistance in the highly disordered structure of glasses, switching has been found in single crystal germanium with impurity concentrations as low as $10^{15}$ per cc.

Figure 7:
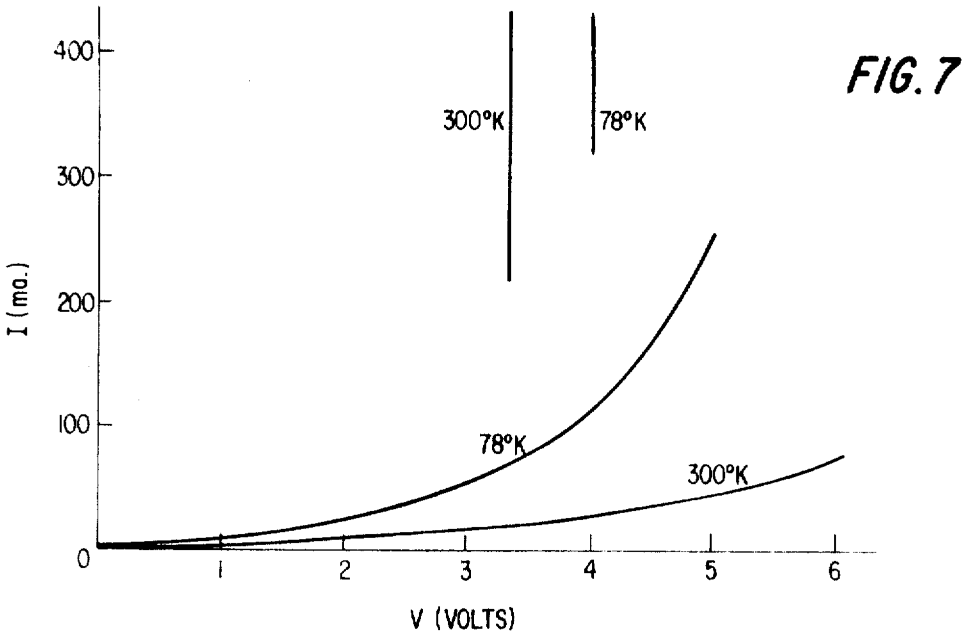
FIG. 7 is a graph of the switching characteristics of a hot-pressed germanium switch at 300° K. and 78° K.
Figure 8:
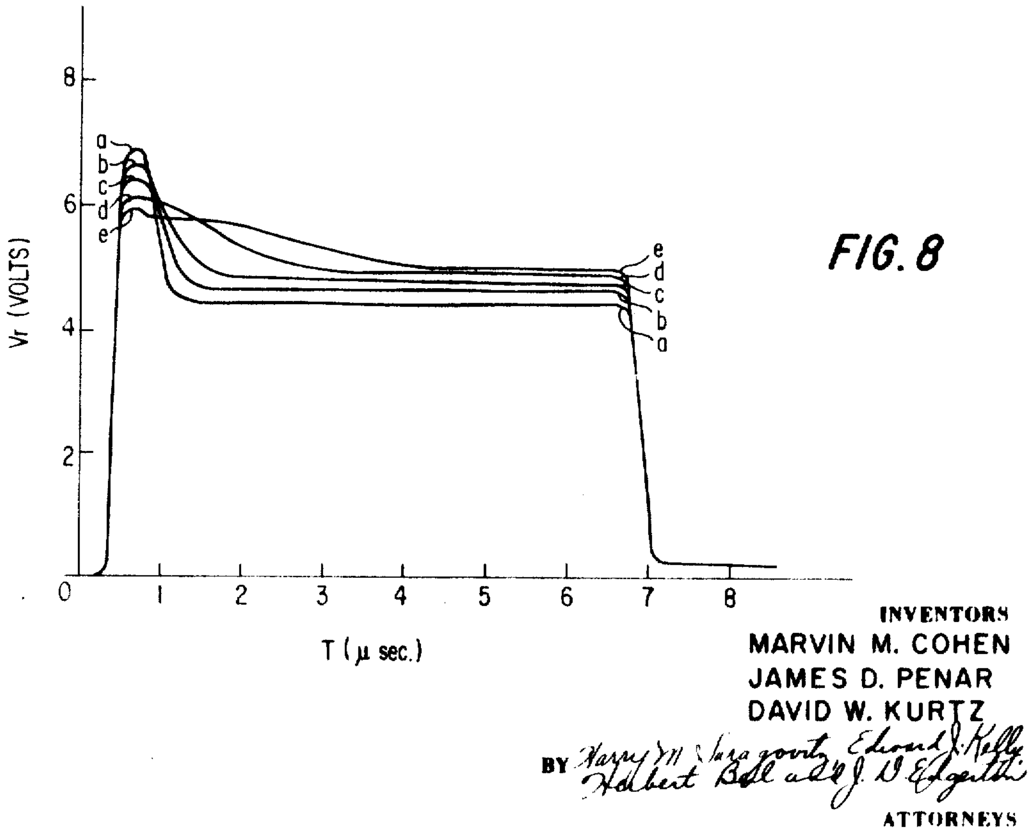
FIG. 8 shows the response of a hot-pressed germanium sample to a voltage pulse. Traces *a* through *e* show the progressively decreasing switching delay times, and holding voltages as the pulse height increases.

A graph showing the temperature dependence of a typical hot-pressed negative resistance device is shown in FIG. 7. When the temperature is lowered from 300° K. to 78° K., the current in the low-conductive region increases and the switching voltage decreases. The holding voltage, however, increases. FIG. 8 shows the response of a hot-pressed device to voltage pulses. As the pulse height reaches this region of the threshold value (trace *a*), there is a delay time after which switching to the holding voltage occurs in several microseconds. As the pulse height increases, the switching time decreases to less than 0.3 $\mu$ sec. (shown consecutively in traces *a* through *e*). The smallest observable switching time for the hot-pressed diode is typically in the range of tenths of microseconds and at the peak of the threshold voltage (13.9 v.), switching time is predicted to be approximately the same as that which has been reported for thin film devices. The delay time, however, is of the same order of magnitude in hot-pressed tunnel diodes and thin film devices.

I wish it to be understood that I do not desire to be limited to the exact details. of construction shown and described, for obvious modifications will occur to a person skilled in the art.

We claim:

1. A high energy radiation resistant semiconductor diode which is characterized by unidirectional switching capabilities and which comprises:

a body portion formed of hot-pressed degenerately doped semiconductor particulate material of a first electrical conductivity;

a whisker probe of opposite conductivity as said body portion attached to one surface of said body portion and forming point contact PN junction at said surface; and an ohmic contact of the same conductivity as said body portion attached to said body portion.

2. The semiconductor diode of claim 1, wherein said particulate semiconductor material is selected from the group consisting of germanium, silicon, GaAs, GaP and ZnTe.

3. The semiconductor diode of claim 2, wherein said semiconductor particulate material is degenerately doped with a material selected from the group consisting of Group III elements of the Periodic Table so that the impurity concentration in said particulate material is in the range of $10^{18}$ to $10^{20}$ per cc.

4. The semiconductor diode of claim 3, wherein said semiconductor particulate material is degenerately doped with a material selected form the group consisting of Group V elements of the Periodic Table so that the impurity concentration is said particulate material is in the range of $10^{18}$ to $10^{20}$ per cc.

5. A high energy radiation resistance semiconductor diode which is characterized by bidirectional switching capabilities and which comprises:

a body portion formed of hot-pressed degenerately doped semiconductor particulate material of the first electrical conductivity, a first whisker probe of opposite conductivity as said body portion attached to one surface of said body portion and forming first point contact PN junction at said surface; and a second whisker probe of opposite conductivity as said body portion attached to a second surface of said body portion and forming a second point contact PN junction.

6. The semiconductor diode of claim 5, wherein said particulate semiconductor materials are selected from the group consisting of germanium, silicon, GaAs, GaP and ZnTe.

7. The semiconductor diode of claim 2, wherein said semiconductor particulate material is degenerately doped with a material selected from the group consisting of Group V elements of the Periodic Table and the impurity concentration in said particulate material is within the range of $10^{18}$ to $10^{20}$ per cc.

8. The semiconductor diode of claim 2, wherein said semiconductor particulate material is degenerately doped with a material selected from the group consisting of Group III elements of he Periodic Table and the impurity concentration in said particulate material is within the range of $10^{18}$ to $10^{20}$ per cc.

9. A process for preparing a high energy radiation resistant semiconductor diode which is characterized by unidirectional switching capabilities and which comprises preparing a melt of semiconductor material selected from the group consisting of germanium, silicon, GaAs, GaP, and ZnTe:

degenerately doping said melt with a material of N-type conductivity selected from the group consisting of Group V elements of the Periodic Table; and crystallizing and comminuting said melt to a particulate size of between 2 microns and 50 microns, hot-pressing said particles to form a wafer body, contacting the whisker probe of a material having a P-type conductivity with one surface of said wafer body and attaching an ohmic contact of N-type conductivity to said wafer body.

10. A process for preparing a high energy radiation resistant semiconductor diode characterized by bidirectional switching capabilities which comprises preparing a melt of semiconductor material selected from the group consisting of germanium, silicon, GaAs, GaP, and ZnTe:

degenerately doping said melt with a material of N-type conductivity selected from the group consisting of Group V elements of the Periodic Table; and crystallizing and comminuting said melt to a particle size of between 2 microns and 50 microns, hot-pressing said particles to form a wafer body, contacting a first whisker probe of a material having a P-type conductivity with one surface of said wafer body and contacting a second whisker probe of a material having a P-type conductivity with said wafer body.